United States Patent
Maw et al.

(10) Patent No.: US 11,527,385 B2
(45) Date of Patent: Dec. 13, 2022

(54) SYSTEMS AND METHODS FOR CALIBRATING CAPACITORS OF MATCHING NETWORKS

(71) Applicant: COMET TECHNOLOGIES USA, INC., San Jose, CA (US)

(72) Inventors: Dean Maw, San Jose, CA (US); Anthony Oliveti, San Jose, CA (US); Keith Rouse, San Jose, CA (US); Gary Russell, San Jose, CA (US)

(73) Assignee: COMET TECHNOLOGIES USA, INC., San Jose, CA (US)

( * ) Notice: Subject to any disclaimer, the term of this patent is extended or adjusted under 35 U.S.C. 154(b) by 49 days.

(21) Appl. No.: 17/244,193

(22) Filed: Apr. 29, 2021

(65) Prior Publication Data

US 2022/0351941 A1    Nov. 3, 2022

(51) Int. Cl.
*H01J 37/32*    (2006.01)

(52) U.S. Cl.
CPC .. *H01J 37/32183* (2013.01); *H01J 37/32935* (2013.01)

(58) Field of Classification Search
CPC ............ H01J 37/32183; H01J 37/32935
See application file for complete search history.

(56) References Cited

U.S. PATENT DOCUMENTS

| | | |
|---|---|---|
| 4,679,007 A | 7/1987 | Reese et al. |
| 5,145,472 A | 9/1992 | Johnson, Jr. et al. |
| 5,195,045 A | 3/1993 | Keane et al. |
| 5,394,061 A | 2/1995 | Fujii |
| 5,474,648 A | 12/1995 | Patrick et al. |

(Continued)

FOREIGN PATENT DOCUMENTS

| | | |
|---|---|---|
| JP | 04239211 A | 8/1992 |
| JP | 05284046 A | 8/1993 |

(Continued)

OTHER PUBLICATIONS

PCT/US2018/062951—International Search Report and Written Opinion of International Searching Authority, dated Aug. 28, 2019, 10 pages.

(Continued)

*Primary Examiner* — Henry Luong
(74) *Attorney, Agent, or Firm* — Nolte Lackenbach Siegel

(57) ABSTRACT

The present disclosure may include a method for calibrating a capacitor in a matching network in a radio frequency plasma processing device, the method including. The method may include identifying the capacitor in the matching network, measuring the impedance of the matching network as a whole, and driving the capacitor from a zero step value to a predefined step value. The method may further include measuring impedance at each step between the zero step value and the predefined step value, identifying the measured impedance for each step value to a predefined impedance curve, and matching a capacitor position to a specific impedance based on the identifying the measured impedance for each step value to the predefined impedance curve. Calibration of matching networks may also be enhanced by optimizing the steps to percentage reported ratio in the range of capacitor values most frequently used.

18 Claims, 10 Drawing Sheets

(56) References Cited

U.S. PATENT DOCUMENTS

| | | |
|---|---|---|
| 5,576,629 A | 11/1996 | Turner et al. |
| 5,609,737 A | 3/1997 | Fukui et al. |
| 5,629,653 A | 5/1997 | Stimson |
| 5,737,175 A | 4/1998 | Grosshart et al. |
| 5,792,261 A | 8/1998 | Hama et al. |
| 5,810,963 A | 9/1998 | Tomioka |
| 5,842,154 A | 11/1998 | Harnett et al. |
| 5,849,136 A | 12/1998 | Mintz et al. |
| 5,866,869 A | 2/1999 | Schneider |
| 5,889,252 A | 3/1999 | Williams et al. |
| 5,910,886 A | 6/1999 | Coleman |
| 5,914,974 A | 6/1999 | Partlo |
| 6,016,131 A | 1/2000 | Sato et al. |
| 6,157,179 A | 12/2000 | Miermans |
| 6,164,241 A | 12/2000 | Chen et al. |
| 6,252,354 B1 | 6/2001 | Collins et al. |
| 6,313,584 B1 | 11/2001 | Johnson et al. |
| 6,313,587 B1 | 11/2001 | MacLennan et al. |
| 6,326,597 B1 | 12/2001 | Lubomirsky et al. |
| 6,407,648 B1 | 6/2002 | Johnson |
| 6,455,437 B1 | 9/2002 | Davidow et al. |
| 6,463,875 B1 | 10/2002 | Chen et al. |
| 6,507,155 B1 | 1/2003 | Barnes et al. |
| 6,677,828 B1 | 1/2004 | Harnett et al. |
| 6,703,080 B2 | 3/2004 | Reyzelman |
| 6,806,437 B2 | 10/2004 | Oh |
| 6,876,155 B2 | 4/2005 | Howald et al. |
| 6,894,245 B2 | 5/2005 | Hoffman et al. |
| 6,949,887 B2 | 9/2005 | Kirkpatrick et al. |
| 7,030,335 B2 | 4/2006 | Hoffman et al. |
| 7,042,311 B1 | 5/2006 | Hilliker et al. |
| 7,079,597 B1 | 7/2006 | Shiraishi et al. |
| 7,102,292 B2 | 9/2006 | Parsons et al. |
| 7,192,505 B2 | 3/2007 | Roche et al. |
| 7,196,283 B2 | 3/2007 | Buchberger, Jr. |
| 7,215,697 B2 | 5/2007 | Hill et al. |
| 7,220,937 B2 | 5/2007 | Hoffman |
| 7,251,121 B2 | 7/2007 | Bhutta |
| 7,259,623 B2 | 8/2007 | Coleman |
| 7,298,128 B2 | 11/2007 | Bhutta |
| 7,467,612 B2 | 12/2008 | Suckewer |
| 7,514,936 B2 | 4/2009 | Anwar |
| 7,795,877 B2 | 9/2010 | Radtke |
| 7,796,368 B2 | 9/2010 | Kotani |
| 8,169,162 B2 | 5/2012 | Yuzurihara |
| 8,203,372 B2 | 6/2012 | Arduini |
| 8,222,822 B2 | 7/2012 | Gilbert |
| 8,421,377 B2 | 4/2013 | Kirchmeier |
| 8,466,622 B2 | 6/2013 | Knaus |
| 8,471,746 B2 | 6/2013 | Kurunezi et al. |
| 8,491,759 B2 | 7/2013 | Pipitone et al. |
| 8,742,669 B2 | 6/2014 | Carter et al. |
| 8,779,662 B2 | 7/2014 | Boston |
| 8,803,424 B2 | 8/2014 | Boston |
| 8,884,180 B2 | 11/2014 | Ilie |
| 8,896,391 B2 | 11/2014 | du Toit |
| 8,928,229 B2 | 1/2015 | Boston |
| 9,042,121 B2 | 5/2015 | Walde et al. |
| 9,065,426 B2 | 6/2015 | Mason et al. |
| 9,105,447 B2 | 8/2015 | Brouk et al. |
| 9,111,725 B2 | 8/2015 | Boston |
| 9,124,248 B2 | 9/2015 | Van Zyl et al. |
| 9,142,388 B2 | 9/2015 | Hoffman et al. |
| 9,148,086 B2 | 9/2015 | Fife et al. |
| 9,166,481 B1 | 10/2015 | Vinciarelli |
| 9,171,700 B2 | 10/2015 | Gilmore |
| 9,196,459 B2 | 11/2015 | Bhutta |
| 9,208,992 B2 | 12/2015 | Brouk et al. |
| 9,224,579 B2 | 12/2015 | Finley et al. |
| 9,225,299 B2 | 12/2015 | Mueller et al. |
| 9,287,098 B2 | 3/2016 | Finley et al. |
| 9,294,100 B2 | 3/2016 | Van Zyl et al. |
| 9,306,533 B1 | 4/2016 | Mavretic |
| 9,313,870 B2 | 4/2016 | Walde et al. |
| 9,337,804 B2 | 5/2016 | Mason et al. |
| 9,345,122 B2 | 5/2016 | Bhutta |
| 9,385,021 B2 | 7/2016 | Chen |
| 9,418,822 B2 | 8/2016 | Kaneko |
| 9,478,397 B2 | 10/2016 | Blackburn et al. |
| 9,483,066 B2 | 11/2016 | Finley et al. |
| 9,490,353 B2 | 11/2016 | Van Zyl et al. |
| 9,496,122 B1 | 11/2016 | Bhutta |
| 9,520,269 B2 | 12/2016 | Finley et al. |
| 9,524,854 B2 | 12/2016 | Hoffman et al. |
| 9,525,412 B2 | 12/2016 | Mavretic |
| 9,536,713 B2 | 1/2017 | Van Zyl et al. |
| 9,543,122 B2 | 1/2017 | Bhutta |
| 9,544,987 B2 | 1/2017 | Mueller et al. |
| 9,558,917 B2 | 1/2017 | Finley |
| 9,577,516 B1 | 2/2017 | Van Zyl et al. |
| 9,578,731 B2 | 2/2017 | Van Zyl |
| 9,584,090 B2 | 2/2017 | Mavretic |
| 9,591,739 B2 | 3/2017 | Bhutta |
| 9,589,767 B2 | 4/2017 | Finley et al. |
| 9,620,340 B2 | 4/2017 | Finley et al. |
| 9,651,957 B1 | 5/2017 | Finley et al. |
| 9,660,613 B2 | 5/2017 | Van Zyl et al. |
| 9,673,028 B2 | 6/2017 | Walde et al. |
| 9,697,911 B2 | 7/2017 | Bhutta |
| 9,711,331 B2 | 7/2017 | Mueller et al. |
| 9,711,335 B2 | 7/2017 | Christie et al. |
| 9,728,378 B2 | 8/2017 | Bhutta et al. |
| 9,729,122 B2 | 8/2017 | Mavretic |
| 9,741,544 B2 | 8/2017 | Van Zyl et al. |
| 9,745,660 B2 | 8/2017 | Bhutta |
| 9,748,076 B1 | 8/2017 | Choi et al. |
| 9,755,641 B1 | 9/2017 | Bhutta |
| 9,773,644 B2 | 9/2017 | Van Zyl et al. |
| 9,807,863 B1 | 10/2017 | Van Zyl et al. |
| 9,812,305 B2 | 11/2017 | Pelleymounter et al. |
| 9,844,127 B2 | 12/2017 | Bhutta |
| 9,852,890 B2 | 12/2017 | Mueller et al. |
| 9,854,659 B2 | 12/2017 | Van Zyl et al. |
| 9,865,432 B1 | 1/2018 | Bhutta |
| 9,952,297 B2 | 4/2018 | Wang |
| 10,008,317 B2 | 6/2018 | Iyer |
| 10,020,752 B1 | 7/2018 | Vinciarelli |
| 10,026,592 B2 | 7/2018 | Chen |
| 10,026,594 B2 | 7/2018 | Bhutta |
| 10,026,595 B2 | 7/2018 | Choi et al. |
| 10,074,518 B2 | 9/2018 | Van Zyl et al. |
| 10,139,285 B2 | 11/2018 | Murray et al. |
| 10,141,788 B2 | 11/2018 | Karnstedt |
| 10,194,518 B2 | 1/2019 | Van Zyl et al. |
| 10,217,618 B2 | 2/2019 | Larson et al. |
| 10,224,184 B2 | 3/2019 | Van Zyl et al. |
| 10,224,186 B2 | 3/2019 | Polak et al. |
| 10,263,577 B2 | 4/2019 | Van Zyl et al. |
| 10,269,540 B1 | 4/2019 | Carter et al. |
| 10,314,156 B2 | 6/2019 | Van Zyl et al. |
| 10,332,730 B2 | 6/2019 | Christie et al. |
| 10,340,879 B2 | 7/2019 | Mavretic |
| 10,373,811 B2 | 8/2019 | Christie et al. |
| 10,374,070 B2 | 8/2019 | Wood |
| 10,410,836 B2 | 9/2019 | McChesney |
| 10,411,769 B2 | 9/2019 | Bae |
| 10,447,174 B1 | 10/2019 | Porter, Jr. et al. |
| 10,469,108 B2 | 11/2019 | Howald |
| 10,475,622 B2 | 11/2019 | Pankratz et al. |
| 2003/0121609 A1 | 7/2003 | Ohmi et al. |
| 2003/0150710 A1 | 8/2003 | Evans et al. |
| 2003/0230984 A1 | 12/2003 | Kitamura et al. |
| 2004/0016402 A1 | 1/2004 | Walther et al. |
| 2004/0026235 A1 | 2/2004 | Stowell, Jr. |
| 2005/0034811 A1 | 2/2005 | Mahoney et al. |
| 2005/0045475 A1 | 3/2005 | Watanabe |
| 2005/0270805 A1 | 12/2005 | Yasumura |
| 2006/0005928 A1 | 1/2006 | Howald |
| 2006/0169582 A1 | 8/2006 | Brown et al. |
| 2006/0169584 A1 | 8/2006 | Brown et al. |
| 2006/0249729 A1 | 11/2006 | Mundt et al. |
| 2007/0121267 A1 | 5/2007 | Kotani |
| 2007/0222428 A1 | 9/2007 | Garvin et al. |
| 2008/0061793 A1 | 3/2008 | Anwar et al. |

(56) References Cited

U.S. PATENT DOCUMENTS

| | | |
|---|---|---|
| 2008/0061901 A1 | 3/2008 | Gilmore |
| 2008/0087381 A1 | 4/2008 | Shannon et al. |
| 2008/0197854 A1 | 8/2008 | Valcore et al. |
| 2008/0272875 A1 | 11/2008 | Huang et al. |
| 2008/0317974 A1 | 12/2008 | de Vries |
| 2009/0026964 A1 | 1/2009 | Knaus |
| 2009/0206974 A1 | 8/2009 | Meinke |
| 2010/0012029 A1 | 1/2010 | Forester et al. |
| 2010/0072172 A1 | 3/2010 | Ui et al. |
| 2010/0096261 A1 | 4/2010 | Hoffman et al. |
| 2010/0098882 A1 | 4/2010 | Lubomirsky et al. |
| 2010/0159120 A1 | 6/2010 | Dzengeleski et al. |
| 2011/0121735 A1 | 5/2011 | Penny |
| 2011/0140607 A1 | 6/2011 | Moore et al. |
| 2011/0148303 A1 | 6/2011 | Van Zyl et al. |
| 2011/0174777 A1 | 7/2011 | Jensen et al. |
| 2012/0097104 A1 | 4/2012 | Pipitone et al. |
| 2012/0097524 A1 | 4/2012 | Pipitone et al. |
| 2012/0145322 A1 | 6/2012 | Gushiken et al. |
| 2012/0164834 A1 | 6/2012 | Jennings et al. |
| 2012/0262064 A1 | 10/2012 | Nagarkatti |
| 2013/0002136 A1 | 1/2013 | Blackburn et al. |
| 2013/0140984 A1 | 6/2013 | Hirayama |
| 2013/0180964 A1 | 7/2013 | Ilic |
| 2013/0214683 A1 | 8/2013 | Valcore et al. |
| 2013/0240482 A1 | 9/2013 | Nam et al. |
| 2013/0278140 A1 | 10/2013 | Mudunuri et al. |
| 2013/0345847 A1 | 12/2013 | Valcore et al. |
| 2014/0225504 A1 | 8/2014 | Kaneko |
| 2014/0239813 A1 | 8/2014 | Van Zyl |
| 2014/0265911 A1 | 9/2014 | Kamata et al. |
| 2014/0328027 A1 | 11/2014 | Zhang et al. |
| 2014/0367043 A1 | 12/2014 | Bishara et al. |
| 2015/0002020 A1 | 1/2015 | Boston |
| 2015/0091440 A1* | 4/2015 | Marakhtanov .... H01J 37/32183 315/111.21 |
| 2015/0115797 A1 | 4/2015 | Yuzurihara |
| 2015/0150710 A1 | 6/2015 | Evans et al. |
| 2015/0313000 A1 | 10/2015 | Thomas et al. |
| 2016/0002020 A1 | 1/2016 | Orita |
| 2016/0248396 A1 | 8/2016 | Mavretic |
| 2016/0308560 A1 | 10/2016 | Howald et al. |
| 2017/0018349 A1 | 1/2017 | Otsubo et al. |
| 2017/0133886 A1 | 5/2017 | Kurs et al. |
| 2017/0338081 A1 | 11/2017 | Yamazawa |
| 2017/0345620 A1 | 11/2017 | Coumou et al. |
| 2018/0034446 A1 | 1/2018 | Wood |
| 2018/0102238 A1 | 4/2018 | Gu et al. |
| 2018/0261431 A1 | 9/2018 | Hammond, IV |
| 2019/0172683 A1 | 6/2019 | Mavretic |
| 2019/0199241 A1 | 6/2019 | Satoshi et al. |
| 2019/0385822 A1 | 12/2019 | Marakhtanov et al. |

FOREIGN PATENT DOCUMENTS

| | | |
|---|---|---|
| JP | 2006-310245 A | 6/2008 |
| JP | 2010-016124 A | 1/2010 |
| JP | 2015-502213 A | 1/2015 |
| KR | 10-2006-0067957 A | 6/2006 |
| KR | 10-2014-0077866 A | 6/2014 |
| KR | 10-2017-0127724 A | 11/2017 |
| KR | 10-2018-0038596 A | 4/2018 |
| WO | 2012054305 | 4/2012 |
| WO | 2012054306 | 4/2012 |
| WO | 2012054307 | 4/2012 |
| WO | 2016048449 A1 | 3/2016 |
| WO | 2016097730 | 6/2016 |
| WO | 2019096564 A1 | 5/2019 |
| WO | 2019147513 A1 | 8/2019 |
| WO | 2019-244734 A1 | 12/2019 |

OTHER PUBLICATIONS

Stowell, et al., "RF-superimposed DC and pulsed DC sputtering for deposition of transparent conductive oxides", Thin Solid Films 515 (2007), pp. 7654-7657.

Bender, et al., "Characterization of a RF=dc-magnetron discharge for the sputter deposition of transparent and highly conductive ITO films", Appl. Phys. A 69, (1999), pp. 397-409.

Economou, Demetre J., "Fundamentals and application of ion-ion plasmas", Applied Surface Science 253 (2007), pp. 6672-6680.

Godyak et al., "Plasma parameter evolution in a periodically pulsed ICP", XXVIIth, Eindhoven, the Netherlands, Jul. 18-22, 2005, 4 pages.

Banna, et al., "Inductively Coupled Pulsed Plasmas in the Presence of Synchronous Pulsed Substrate Bias for Robust, Reliable, and Fine Conductor Etching", IEEE Transactions on Plasma Science, vol. 37, No. 9, Sep. 2009, pp. 1730-1746.

Kushner, Mark J., "Pulsed Plasmas as a Method to Improve Uniformity During Materials Processing", Journal of Applied Physics, Jul. 1, 2004, vol. 96, No. 1, pp. 82-93.

LTM Technologies, M. Haass "Synchronous Plasma Pulsing for Etch Applications", Apr. 3, 2010 16 pages.

PCT/US2020/038892—International Search Report and Written Opinion of the International Searching Authority, dated Oct. 6, 2020, 3 pages.

PCT/US2020/038899—International Search Report and Written Opinion of the International Searching Authority, dated Sep. 26, 2019, 5 pages.

PCT/US2021/012847—International Search Report and Written Opinion of the International Searching Authority, dated May 6, 2021, 11 pages.

PCT/US2021/012849 International Search Report and Written Opinion of the International Searching Authority, dated May 10, 2021, 11 pages.

PCT/US2021/012851 International Search Report and Written Opinion of the International Searching Authority, dated May 6, 2021, 10 pages.

* cited by examiner

SYSTEMS AND METHODS FOR CALIBRATING CAPACITORS OF MATCHING NETWORKS

BACKGROUND

Radio frequency (RF) plasma-enhanced processing is extensively used in semiconductor manufacturing to etch different types of films, deposit thin films at low to intermediate processing temperatures, and perform surface treatment and cleaning. One characteristic of such processes is the employment of a plasma, i.e., a partially ionized gas, that is used to generate neutral species and ions from precursors inside a reaction chamber, provide energy for ion bombardment, and/or perform other actions. Radio frequency plasma-enhanced processing is performed by what are known as radio frequency processing devices.

Radio frequency processing devices may include a radio frequency generator that transmits a signal to a plasma reaction chamber. A radio frequency matching device, which may have a variable impedance, may be located between the radio frequency generator and the plasma reaction chamber. The radio frequency matching device may be controlled, or otherwise tuned by varying the impedance of the radio frequency matching device. Tuning the radio frequency matching device reduces reflected power from the plasma reaction chamber and/or the radio frequency matching device, which may increase power that is transferred from the radio frequency generator to the plasma reaction chamber and into the plasma process.

BRIEF DESCRIPTION OF THE DRAWINGS

The present disclosure is best understood from the following detailed description when read with the accompanying Figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
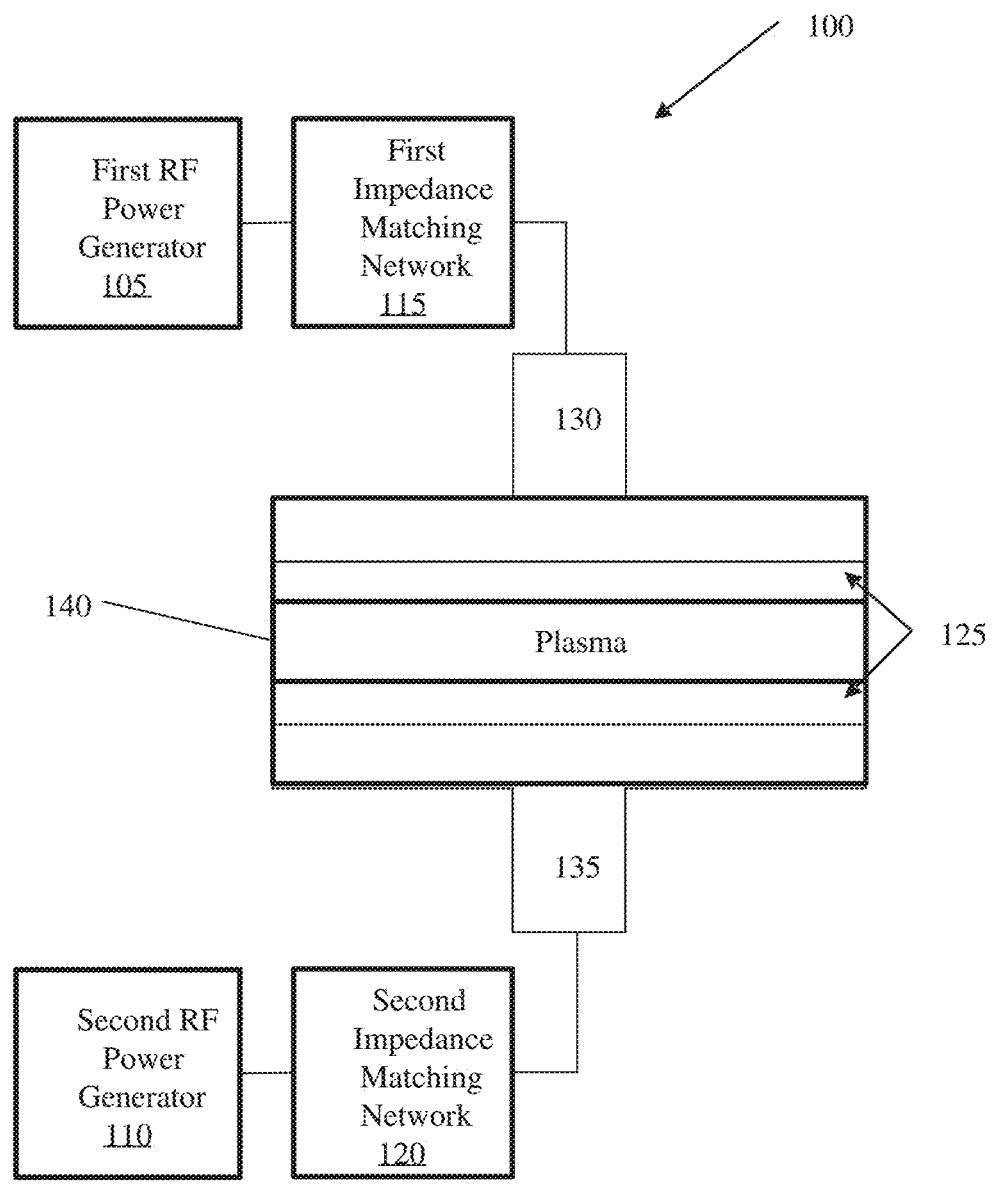
FIG. 1 is a block diagram representation of a radio frequency plasma processing device according to embodiments of the present disclosure.

Illustrative examples of the subject matter claimed below will now be disclosed. In the interest of clarity, not all features of an actual implementation are described for every example in this specification. It will be appreciated that in the development of any such actual implementation, numerous implementation-specific decisions may be made to achieve the developers' specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

Further, as used herein, the article "a" is intended to have its ordinary meaning in the patent arts, namely "one or more." Herein, the term "about" when applied to a value generally means within the tolerance range of the equipment used to produce the value, or in some examples, means plus or minus 10%, or plus or minus 5%, or plus or minus 1%, unless otherwise expressly specified. Further, herein the term "substantially" as used herein means a majority, or almost all, or all, or an amount with a range of about 51% to about 100%, for example. Moreover, examples herein are intended to be illustrative only and are presented for discussion purposes and not by way of limitation.

Embodiments of the present disclosure may provide systems and methods for tuning and otherwise controlling matching networks in radio frequency plasma processing devices. During operation, a radio frequency generator may be energized to form a plasma within a reaction chamber. The plasma may be produced after a source gas is injected into the reaction chamber and power is supplied within the reaction chamber by the radio frequency generator.

Under certain conditions, the power that is supplied to the reaction chamber may be reflected back from the reaction chamber. One cause of the reflected power may be a mismatch in the characteristic impedance of the system and the load formed by the plasma within the reaction chamber. To help prevent reflected power, a matching network may be disposed between the radio frequency generator and the reaction chamber. Such matching networks may include a number of variable capacitors or other impedance elements. The variable capacitors may be tuned so that the complex load impedance within the reaction chamber matches the impedance of the radio frequency generator.

While multiple methods of controlling or otherwise tuning matching networks have been used, such methods may not reliably and efficiently result in impedance matching. Matching networks may include stepper motors, which have a specific number of steps that are a function unique to a particular stepper motor. During operation, a capacitor may be driven by a motor that has a range between zero and one hundred percent and the motor may, as a result, have a number of clicks. Embodiments of the present disclosure may provide recipes and/or otherwise allow for the adjustment of a capacitor position based, at least in part, on "a steps to percent ratio."

Embodiments of the present disclosure may provide systems and methods for the calibration of matching networks using a steps to percent ratio to minimize, or at least address, the currently experienced problems identified above. For example, addressing the above issues may include adjusting a property of one or more capacitors within the matching network.

Turning to FIG. 1, a side view block diagram representation of a radio frequency plasma processing system 100 is illustrated, according to embodiments of the present disclosure. Radio frequency plasma processing system 100 includes a first radio frequency generator 105 and a second radio frequency generator 110, a first impedance matching network 115, a second impedance matching network 120, a sheath 125, a plasma powering device, such as showerhead 130 or equivalent powered element such as an electrode, and a pedestal 135. As used herein, plasma power devices may refer to any device that introduces power to generate plasma and may include, for example, showerhead 130 and/or other types of electrodes, as well as antennae and the like.

Radio frequency plasma processing system 100 may include one or more first and second radio frequency generators 105, 110 that deliver power to a reaction chamber 140 through one or more impedance matching networks 115, 120. In this example, radio frequency power flows from the first radio frequency generator 105 through the first impedance matching network 115 to showerhead 130 into plasma in reaction chamber 140, to an electrode (not shown) other than showerhead 130, or to an inductive antenna (not shown) that electromagnetically provides power to the plasma. After which the power flows from the plasma to ground and/or to pedestal 135 and/or to second impedance matching network 120. Generally, first impedance matching network 115 compensates for variations in a load impedance inside reaction chamber 140 so the combined impedance of showerhead 130 and first impedance matching network 115 is equal to the optimal load impedance of the first radio frequency generator 105 by adjusting the reactive components (not separately shown), e.g., variable capacitors, within first impedance matching network 115.

In certain examples, first radio frequency generator 105 may provide power at a RF frequency between about 400 KHz and 150 MHz, while second radio frequency generator 110 connected to pedestal 135 may supply power at a radio frequency lower than that of first radio frequency generator 105. However, in certain implementations, second radio frequency generator 110 may not supply power at a radio frequency lower than that of first radio frequency generator 105. Typically, the frequencies of first and second radio frequency generators 105, 110 are such that first radio frequency generator 105 is at a radio frequency that is not an integer multiple, nor integer fraction, of the frequency of second radio frequency generator 110.

Impedance matching networks 115, 120 are designed to adjust their internal reactive elements such that the load impedance matches the source impedance. In other examples of the plasma processing device 100, different numbers of radio frequency power generators 105/110 may be used, as well as different numbers of impedance matching networks 115/120. Impedance matching networks 115/120 may include a number of internal components, such as coils and variable capacitors, which will be discussed in greater detail below.

Figure 2:
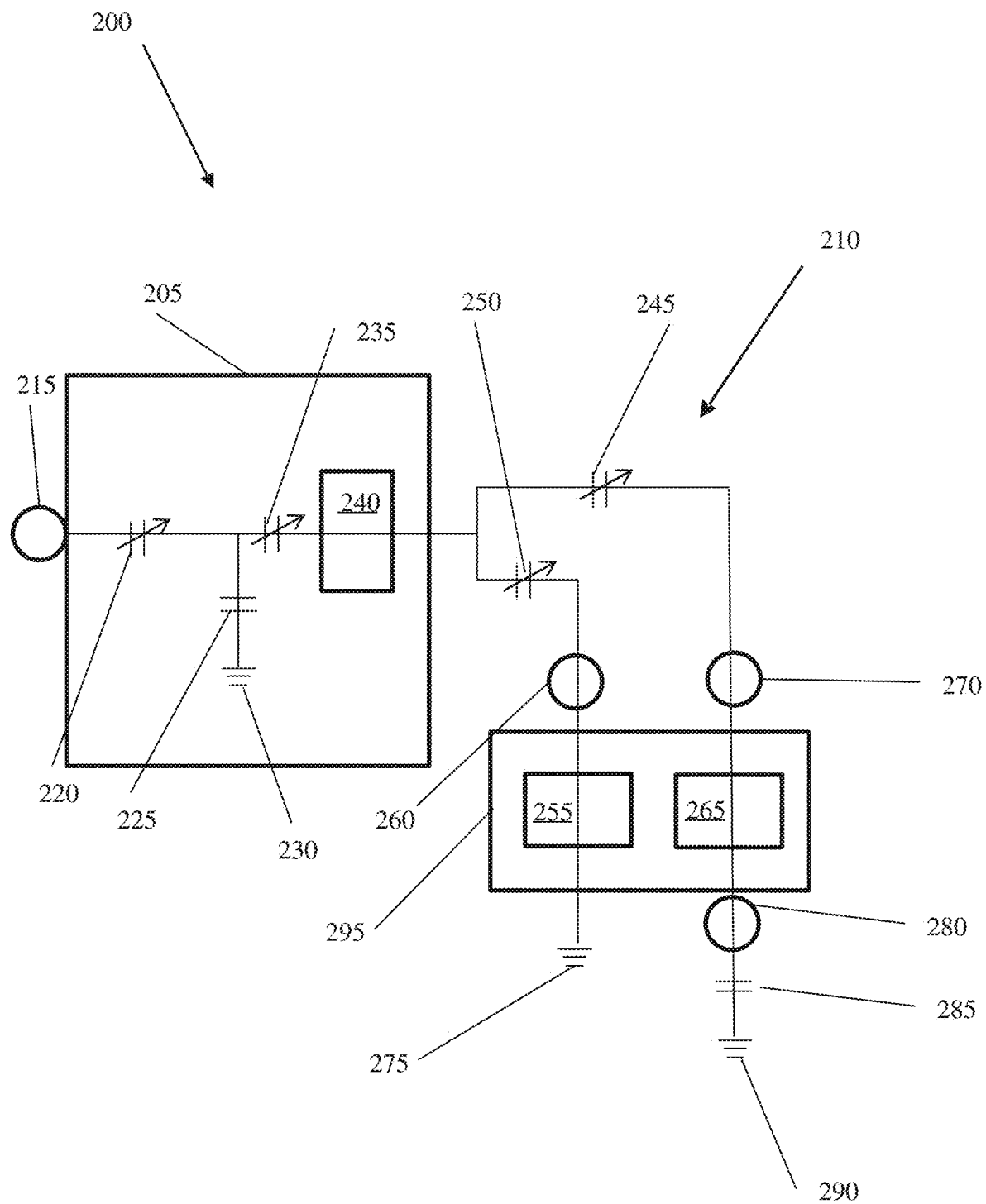
FIG. 2 is a schematic representation of a matching network according to embodiments of the present disclosure.

Turning to FIG. 2, a schematic representation of a matching network according to embodiments of the present disclosure is shown. In this embodiment, a matching network 200, such as those described above with respect to FIG. 1, is illustrated having a matching branch 205 and a splitter branch 210. Matching branch 205 receives radio frequency power from an input 215. A first variable capacitor 220 of the matching branch 205 receives the radio frequency power from the input 215. First variable capacitor 220 may include a capacitor rated at approximately 10-2000 pF.

First variable capacitor 220 is connected to a second capacitor 225, which is connected to a ground 230. Second capacitor 225 is also connected to a third variable capacitor 235. Third variable capacitor 235 may include a capacitor rated at approximately 10-2000 pF. Third variable capacitor 235 is also connected to an inductor 240, which further connects to splitter branch 210.

Splitter branch 210 receives radio frequency power from matching branch 205, which, splits the received radio frequency power between a fourth variable capacitor 245 and a fifth variable capacitor 250. Fourth variable capacitor 245 may be rated at approximately 10-2000 pF, while fifth variable capacitor 250 may be rated at approximately 10-2000 pF.

Fifth variable capacitor 250 is connected to an inner coil 255. Between fifth variable capacitor 245 and inner coil 255, one or more sensors 260 may be disposed. Sensor 260 may be used to measure, for example, voltage between fifth variable capacitor 250 and ground 275. Similarly, fourth variable capacitor 245 is connected to an outer coil 265. Between fourth variable capacitor 245 and outer coil 265, one or more sensors 270 may be disposed. Sensors 270 may be used to measure, for example, voltage between fourth variable capacitor 245 and ground 290.

Inner coil 255 may further be connected to a ground 275 and outer coil 265 may be connected to circuitry that includes a sensor 280 and a sixth capacitor 285. Sensor 280 may be used to measure, for example, voltage between outer coil 265 and ground 290. Inner coil 255 and outer coil 265 may be located outside of the matching network 200 circuitry, as indicated by offset box 295.

As discussed above, the circuitry illustrated in FIG. 2 may be used to tune first variable capacitor 220, third variable capacitor 235, fourth variable capacitor 245, and fifth variable capacitor 250. By tuning first variable capacitor 220, third variable capacitor 235, fourth variable capacitor 245, and fifth variable capacitor 250 the power provided to inner coil 255 and outer coil 265 may be adjusted.

The circuitry, which in one embodiment may be employed in matching network 200 as a current split ratio matching network, may be controlled using a programmable logic controller (not shown), which may be disposed in or otherwise connected to matching network 200. Suitable programmable logic controllers and associated components will be discussed further with respect to FIG. 3.

In other embodiments, the circuitry of matching network 200 may include fewer or additional components, and the orientation of the circuitry may differ. For example, fewer or greater numbers of variable capacitors, inductors, sensors, and the like may be present. Additionally, in certain embodiments, a different orientation of coils, antennas, and the like may be used to provide tuned radio frequency power to a reaction chamber (not shown in FIG. 2). Systems and methods disclosed herein may be used inductively coupled plasmas ("ICPs"), capacitively coupled plasmas ("CCPs"), helicon wave sources ("HWSs"), or any other plasma processing devices.

Figure 3:
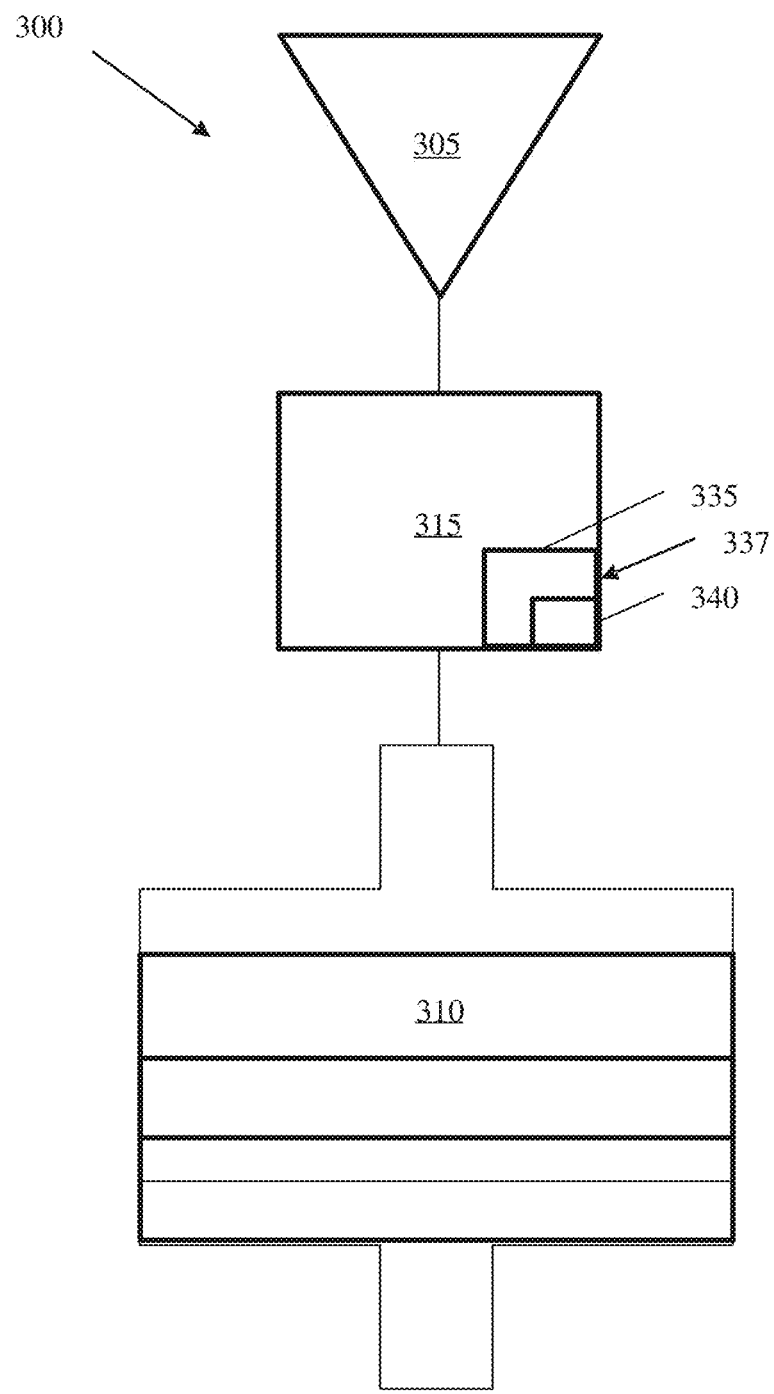
FIG. 3 is a schematic representation of a plasma processing device according to embodiments of the present disclosure.

Turning to FIG. 3, a schematic representation of a radio frequency plasma processing device 300 according to embodiments of the present disclosure is shown. In this embodiment, radio frequency plasma processing device 300 includes a radio frequency generator 305. Radio frequency generator 305 is configured to provide power to reaction chamber 310. Radio frequency generator 305 may provide power at a radio frequency between about 400 KHz and about 150 MHz. In certain embodiments, a second radio frequency generator (not shown) may also be present within radio frequency plasma processing device 300 and may provide power at a radio frequency that is the same, lower, or higher than radio frequency generator 305.

Reaction chamber 310 may include various components that allow for the processing of a manufacturing operation, such as those associated with the semiconductor industries. Reaction chamber 310 may include one or more sensors (not shown) for measuring certain properties occurring within reaction chamber 310. Reaction chamber 310 may also include a pedestal (also not shown) on which substrates to be manufactured may be placed during operation. Reaction chamber 310 may also include or otherwise be connected to coils (not individually shown), such as those discussed above, as well as showerheads, etc.

Radio frequency plasma processing device 300 may also include a matching network 315. Matching network 315 may be located between radio frequency generator 305 and reaction chamber 310. Matching network 315 may include variable capacitors (not shown), as well as other components to balance impedance between radio frequency generator 305 and reaction chamber 310, as discussed in greater detail above. During operation, the matching network may be tuned, e.g., by adjusting capacitor positions, in order to provide the matching impedances.

During operation, as power is supplied from radio frequency generator 305 to a plasma (not shown) within reaction chamber 310, a condition may occur, such as power may be reflected from reaction chamber 310. Such reflected power may result in undesirable conditions, which result in inefficient processing, damage to a substrate, damage to components of radio frequency plasma processing device 300, and the like. To resolve the condition and improve operability of radio frequency processing device 300, a tuning module 337 includes programmable logic controller 335 that may provide commands to matching network 315 to adjust a capacitor position, thereby providing matching impedances to minimize reflected power. Programmable logic controller 335 may be connected to storage device 340 to store these commands or data obtained during operation.

During operation, programmable logic controller 335 may identify a capacitor within matching network 315. The identifying may occur automatically or be controlled by an operator. Along with identifying the capacitor, the impedance of the matching network as a whole may be measured. Measuring the impedance of matching network 315 as a whole may include measuring a plurality of impedance values for one or more capacitors and/or other components within matching network 315. The capacitor may then be driven from a zero step value, which represents the point of minimum capacitance within its usable range. For example, in certain embodiments, the predefined step value may be about two thousand steps, while in other embodiments, the predefined step value may be more or less than two thousand steps. During operation, the capacitor is not actually used in all two thousand steps and/or the number of steps defined by the predefined step value. However, by determining the impedance at each step value, where the number of steps is determined by specifics of the operation and may vary between, for example, one and two thousand or more, the impedance for specific capacitor positions within matching network 315 may be identified.

After the impedance is measured for each step, the impedance for particular capacitor positions may be saved in, for example, a table or database, which may be used during operation to adjust operation of matching network 315. As such, the impedance for a particular capacitor position may be referenced during operation of matching network 315. Thus, as capacitor positions are adjusted within matching network 315, the capacitor positions may be adjusted based on a predefined impedance curve, as set forth within a table and/or database that may be stored on memory associated with programmable logic controller 335. Using the measured impedance for each position of the capacitors for matching network 315, a table is constructed of the reported positions of the capacitors, thereby optimizing the initial tuning conditions for a plasma processing recipe.

As explained above, during operation, the capacitor is not used in every step, rather, the capacitor is generally used within a selected region. Using the embodiments provided herein, a region of usage for a specific capacitor may be identified, and as such, the steps per percent usage of a capacitor may be identified. By identifying the region where a capacitor is used, the steps to percent usage ratio may be increased, thereby increasing the repeatability of capacitor position during operation. For example, in certain embodiments, a range of step values may be identified where the capacitor position occurs about ninety percent of a time period. In other embodiments, the time period may include capacitor position location more than fifty percent, more than sixty percent, more than seventy percent, more than eighty percent more than ninety-five percent, etc. By identifying the range of usage within matching network 315 for one or more operations, the steps percent to usage ratio may be increased, thereby increasing the repeatability of capacitor position reporting. Accordingly, in certain embodiments, a steps per percent usage ratio may be stored in the database/data structure and used to improve reported capacitor position repeatability.

Figure 4:
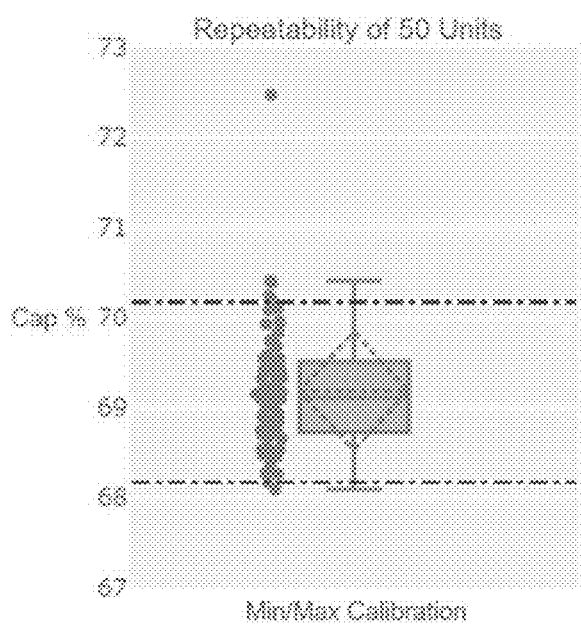
FIG. 4 is a graph/plot illustrating use of a minimum and a maximum capacitance point for a radio frequency plasma processing device.
Figure 5:
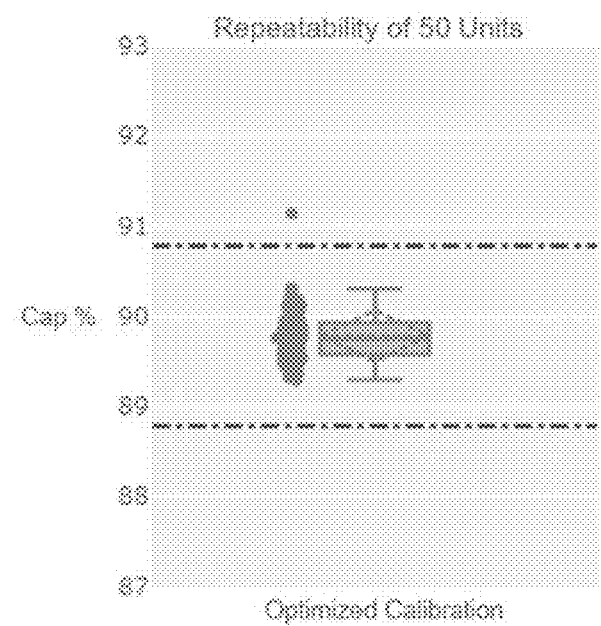
FIG. 5 is a graph/plot illustrating use of reported capacitor positions based on network impedance according to embodiments of the present disclosure.

Turning to FIGS. 4 and 5, a graph using minimum and maximum capacitance points and a graph using reported capacitor positions based on network impedance, respectively, according to embodiments of the present disclosure are shown. FIG. 4 illustrates the repeatability of capacitor position based on minimum and maximum capacitance points for a sample size of fifty. As illustrated, using about twenty steps per percent ratio using minimum and maximum values results in a relatively wide band of capacitor positions.

FIG. 5 illustrates using reported capacitor positions based on network impedance according to embodiments of the present disclosure. By optimizing the steps to percent usage ratio, less than twenty steps may be used for the actual usage of the capacitor when determining optimized capacitor position. As such, capacitor position for a particular operation may be more repeatably applied because the actual usage of the capacitor during operation is considered rather than only minimum and maximum values.

Figure 6A:
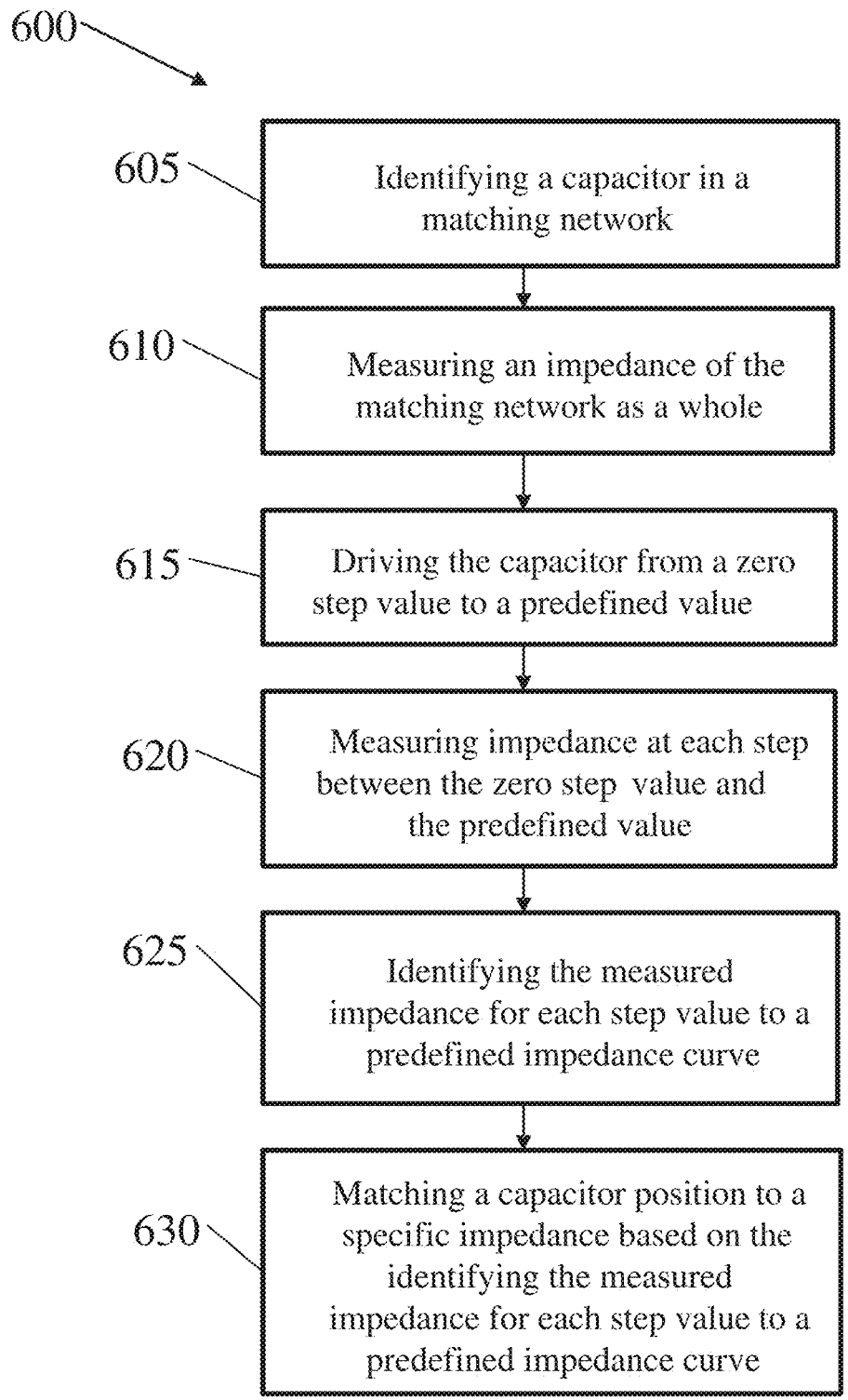
FIG. 6A is a flowchart of one example method for tuning a matching network in a radio frequency plasma processing device according to embodiments of the present disclosure.

Turning to FIG. 6A, a flowchart of a method 600 for calibrating a matching network in a radio frequency plasma processing device, according to embodiments of the present disclosure is shown. The method 600 may include identifying (block 605) a capacitor in the matching network. The identifying may include determining a specific capacitor within a matching network and/or may include determining more than one capacitor within the matching network. The capacitors may include variable capacitors, such as those discussed above.

During operation, method 600 may further include measuring (block 610) the impedance of the matching network as a whole. Measuring the impedance of the matching network may include measuring specific capacitors, multiple capacitors in a matching network, and/or measuring other aspects of a radio frequency plasma processing device. The measuring may include using one or more sensors within a radio frequency plasma processing device to determine a total impedance within the matching network.

During operation, method 600 may further include driving (block 615) the capacitor from a zero step value to a predefined step value. The predetermined step value may vary depending on the operational constraints of the radio frequency plasma processing device, including the specific operational aspects of the matching network. In certain embodiments the predefined step value may include at least two thousand steps, while in other embodiments, there may be more or less than two thousand steps. By driving the capacitor, capacitor positions may be determined for specific step values, thereby allowing aspects of the radio frequency plasma processing device to be analyzed.

During operation, method 600, may further include measuring (block 620) impedance at each step between the zero step value and the predefined step value. By measuring the impedance at each step, an impedance for each capacitor position may be determined. The measuring may also include determining that step values where the capacitor operates for specific conditions. For example, the capacitor may be in a particular position the majority of the time it is in operation. For commonly used conditions, a higher steps per percentage ratio is used, thereby reporting increased accuracy and repeatability of capacitor positions.

During operation, method 600 may further include identifying (block 625) the measured impedance for each step value to a predefined impedance curve. The predefined impedance curve may include a known value based on prior testing and/or diagnostics for a capacitor and/or a capacitor within a matching network and/or radio frequency plasma processing device.

During operation, method 600 may further include matching (block 630) a capacitor position to a specific impedance based on the identifying the measured impedance for each step value to a predefine impedance curve. When the range of capacitor positions are known for a specific capacitor within a matching network, the capacitor positions may be tuned in order to increase the repeatability of obtaining a correct and/or optimized capacitor position for a particular operation. Accordingly, optimizing a step value per percent usage of the capacitor at a particular location for a particular operation may thereby further increase the repeatability for a matching network. By using the most used operational range for a capacitor within a matching network the steps per percentage ratio may be optimized, thereby increasing the repeatability of capacitor positions during operation of the matching network.

Figure 6B:
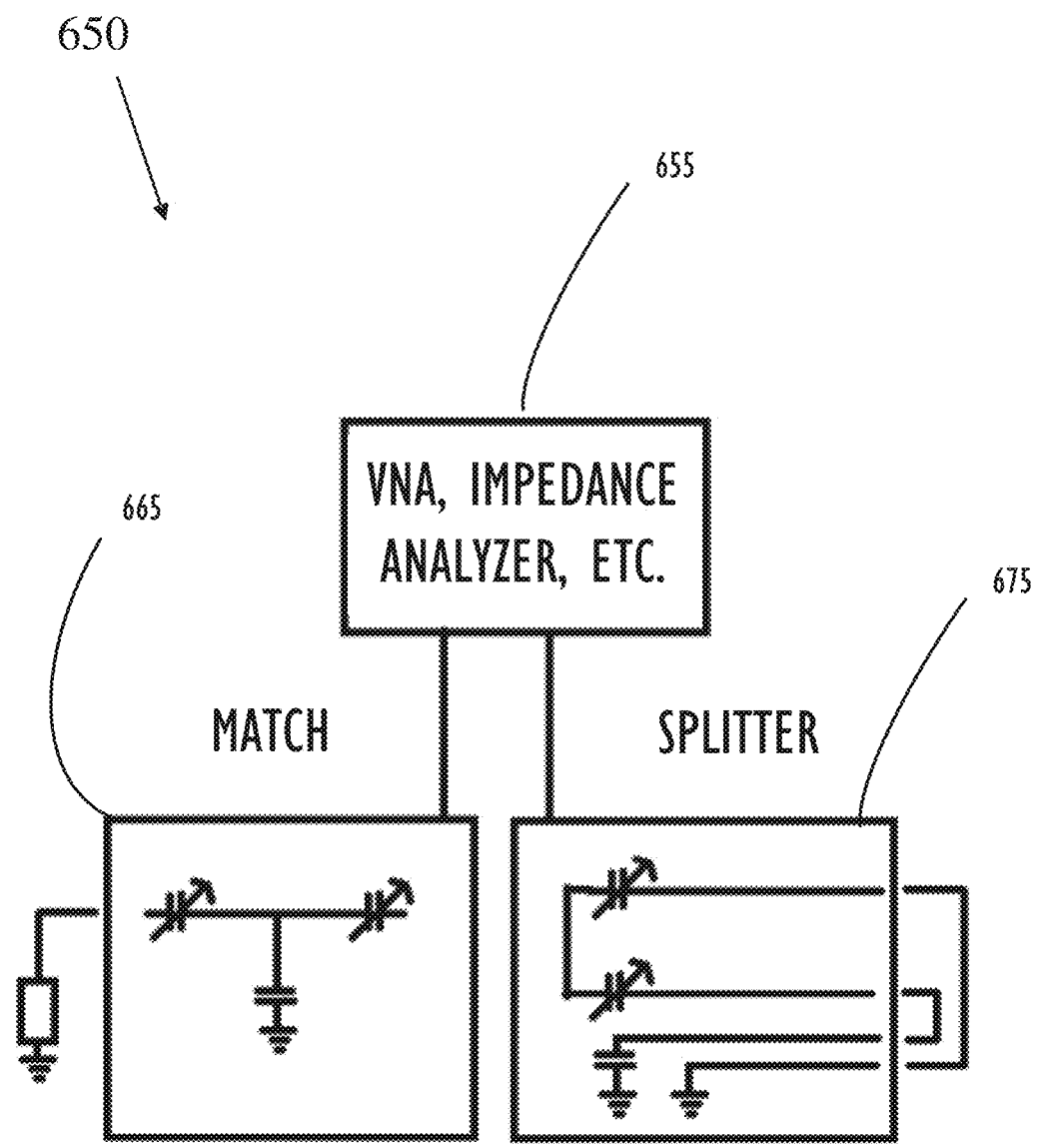
FIG. 6B is a block diagram of components that may be used to implement the method of FIG. 6A according to embodiments of the present disclosure.

FIG. 6B illustrates a block diagram 650 that includes multiple components that may be used to implement method 600. Specifically block diagram 650 illustrates one possible relationship between an impedance analyzer 655, a match component 665, and a splitter 675.

Figure 7:
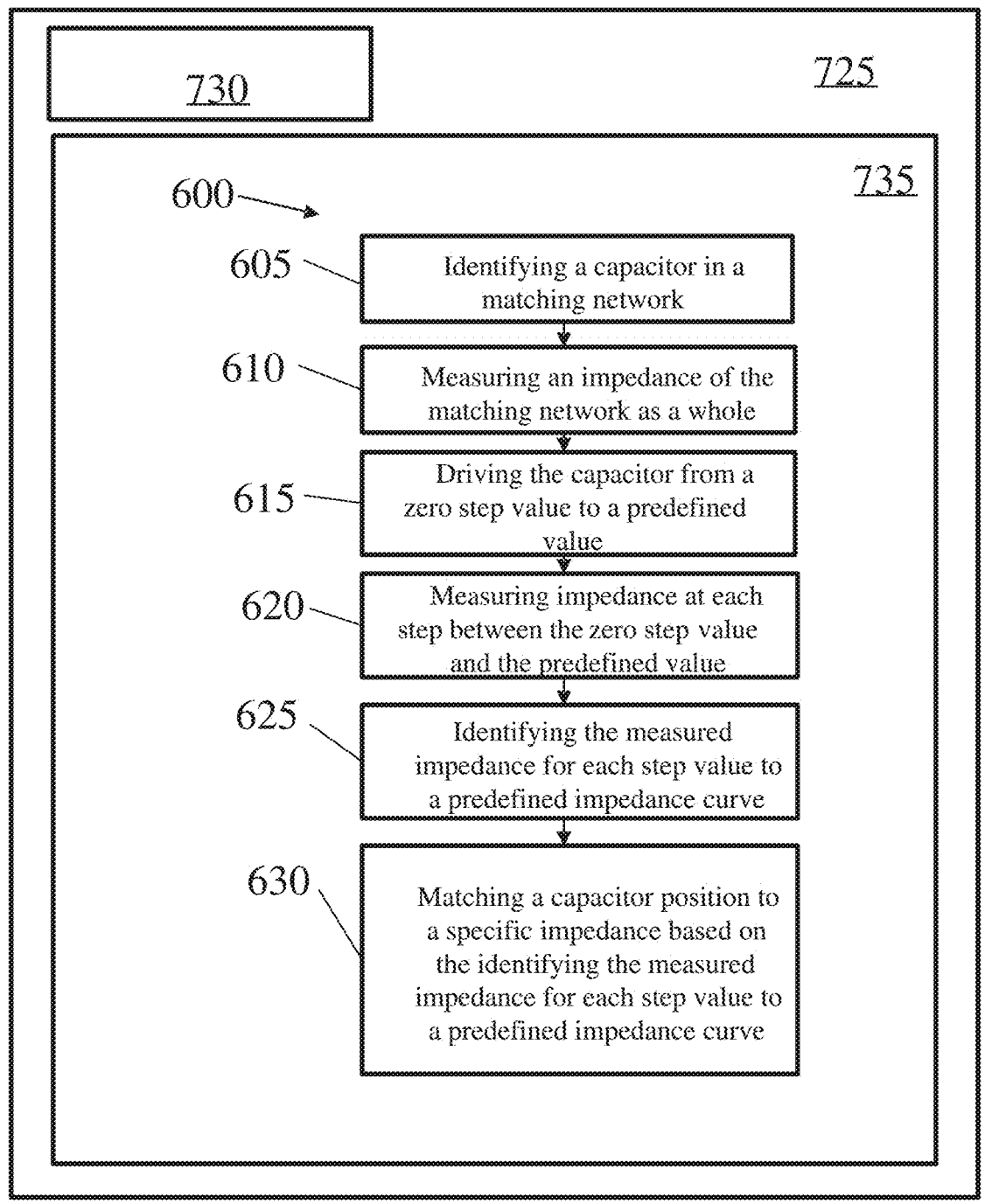
FIG. 7 is an example computing device with a hardware processor and accessible machine-readable instructions (e.g., instructions stored in a non-transitory computer readable medium) in accordance with one or more examples of the present disclosure.

Turning now to FIG. 7, an example computing device with a hardware processor and accessible machine-readable instructions 600 is shown in accordance with one or more examples of the present disclosure. FIG. 7 provides the same aspects discussed above with respect to FIG. 6, and as such, for purposes of clarity, only the differences in the figures will be discussed herein. FIG. 7 provides an example computing device 725, with a hardware processor 730, and accessible machine-readable instructions stored on a machine-readable medium 735 for managing data as discussed above with respect to one or more disclosed example implementations. FIG. 6 illustrates computing device 725 configured to perform the flow described in blocks 605, 610, 615, 620, 625, and 630 discussed in detail with respect to FIG. 6. However, computing device 725 may also be configured to perform the flow of other methods, techniques, functions, or processes described in this disclosure.

Figure 8:
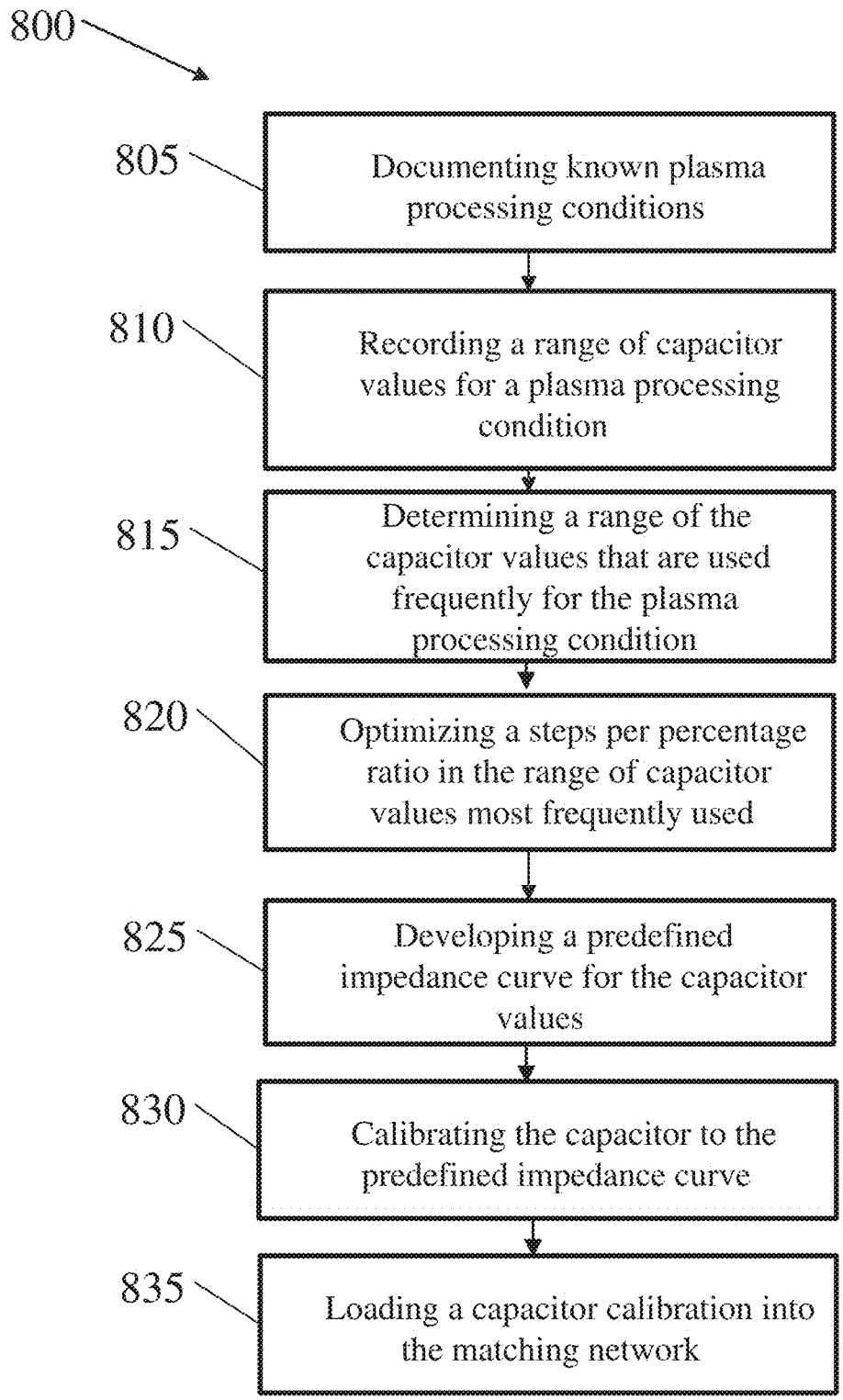
FIG. 8 is a flowchart of one example method for tuning a matching network in a radio frequency plasma processing device according to embodiments of the present disclosure.

Turning to FIG. 8, a flowchart of a method for calibrating a matching network in a radio frequency plasma processing device, according to embodiments of the present disclosure is shown. During operation, method 800 may include calibrating a capacitor in a matching network in a radio frequency plasma processing device. The method 800 may include documenting (805) known plasma processing conditions.

During operation, method 800 may further include recording (block 810) for a range of capacitor values for a plasma processing condition. Method 800 may further include determining (block 815) a range of the capacitor values that are used frequently for the plasma processing condition.

During operation, method 800 may further include optimizing a steps per percentage ratio in the rage of capacitor values most frequently used. Method 800 may further include developing (block 825) a predefined impedance curve for the capacitor values.

During operation, method 800 may further include calibrating (block 830) the capacitor to the predefined impedance curve. Method 800 may further include loading (block 835) a capacitor calibration into the matching network.

Figure 9:
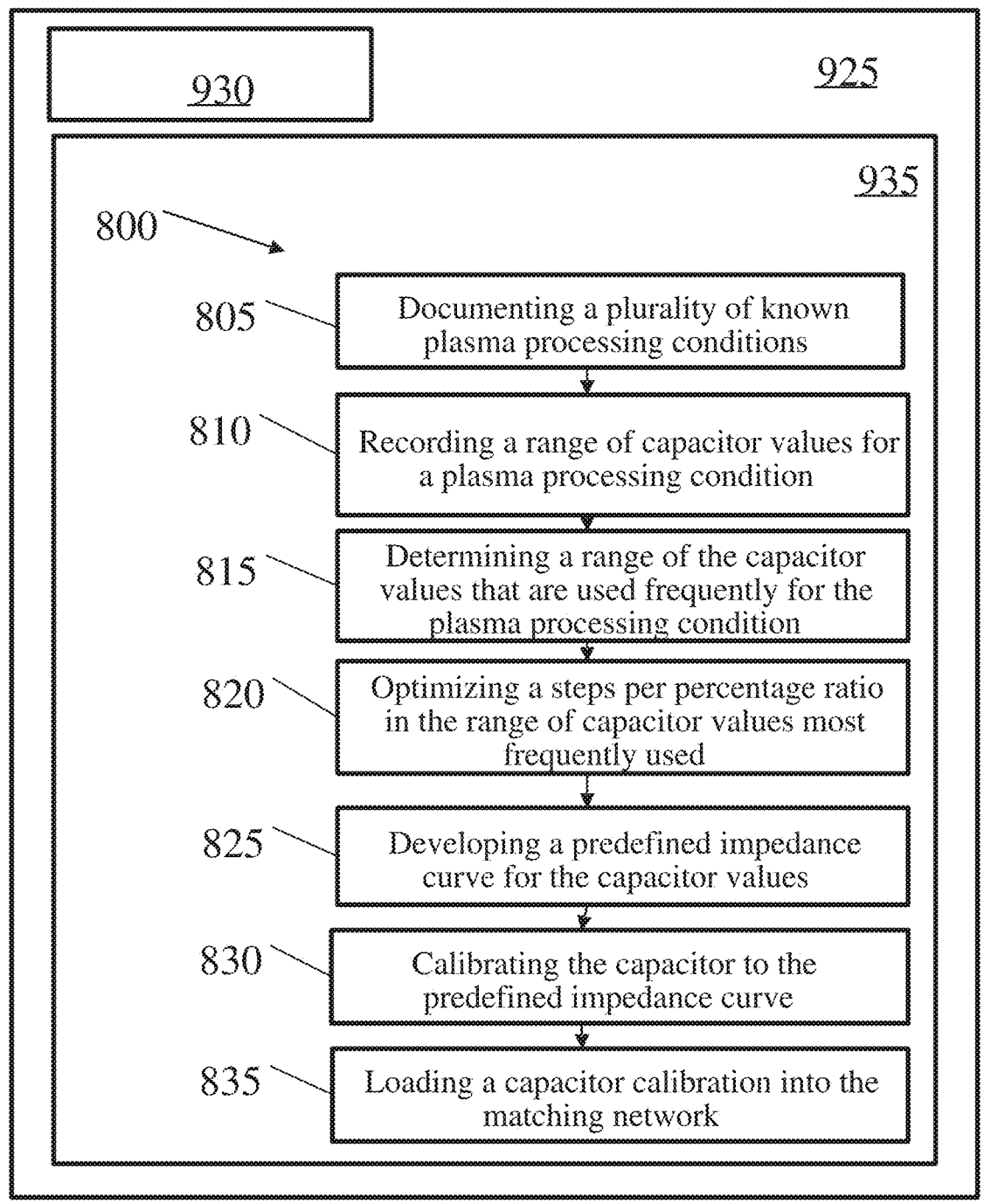
FIG. 9 is an example computing device with a hardware processor and accessible machine-readable instructions (e.g., instructions stored in a non-transitory computer readable medium) in accordance with one or more examples of the present disclosure.

Turning now to FIG. 9, an example computing device with a hardware processor and accessible machine-readable instructions is shown in accordance with one or more examples of the present disclosure. FIG. 9 provides the same structural components discussed above with respect to FIG. 8, and as such, for purposes of clarity, only the differences in the figures will be discussed herein. FIG. 9 provides an example computing device 925, with a hardware processor 930, and accessible machine-readable instructions stored on a machine-readable medium 935 for managing data as discussed above with respect to one or more disclosed example implementations. FIG. 8 illustrates computing device 925 configured to perform the flow described in blocks 805, 810, 815, 820, 825, 830, and 835 discussed in detail with respect to FIG. 8. However, computing device 925 may also be configured to perform the flow of other methods, techniques, functions, or processes described in this disclosure.

Figure 10:
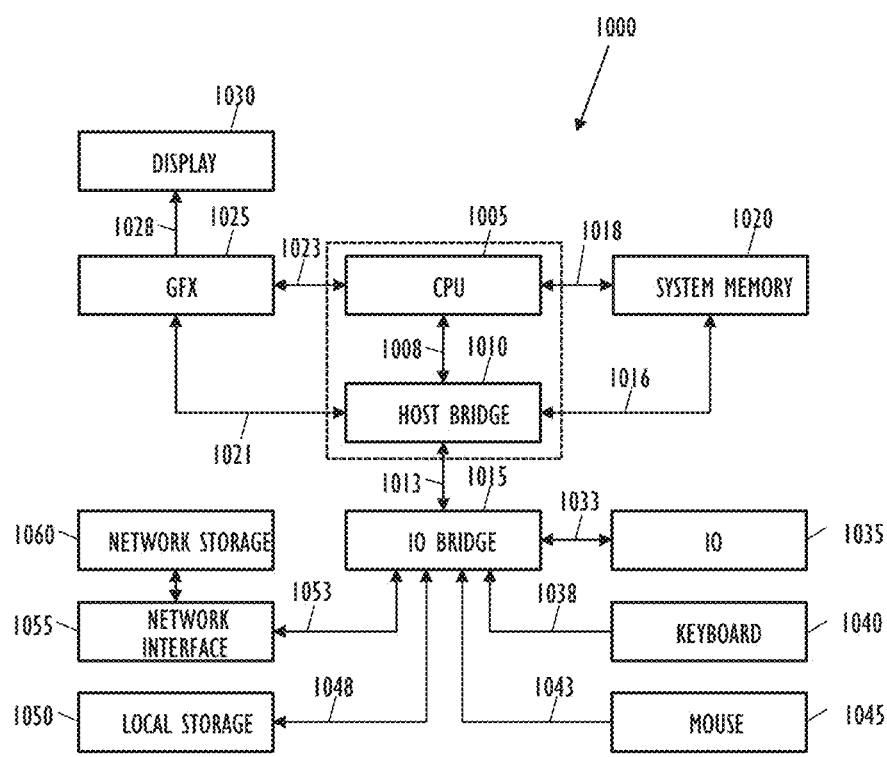
FIG. 10 is a schematic representation of a computer processing device that may be used to implement functions and processes in accordance with one or more examples of the present disclosure.

Referring now to FIG. 10, a schematic representation of a computer processing device 1000 that may be used to implement functions and processes in accordance with one or more examples of the present disclosure is shown. FIG. 10 illustrates a computer processing device 1000 that may be used to implement the systems, methods, and processes of this disclosure. For example, computer processing device 1000 illustrated in FIG. 10 could represent a client device or a physical server device and include either hardware or virtual processor(s) depending on the level of abstraction of the computing device. In some instances (without abstraction), computer processing device 1000 and its elements, as shown in FIG. 10, each relate to physical hardware. Alternatively, in some instances one, more, or all of the elements could be implemented using emulators or virtual machines as levels of abstraction. In any case, no matter how many levels of abstraction away from the physical hardware, computer processing device 1000 at its lowest level may be implemented on physical hardware. In one implementation, computer processing device 1000 may allow a subscriber to remotely access one or more data centers. Similarly, the management tool used by the subscriber may include a software solution that runs on such a computer processing device 1000.

FIG. 10 shows a computer processing device 1000 in accordance with one or more examples of the present disclosure. Computer processing device 1000 may be used to implement aspects of the present disclosure, such as aspects associated with the tuning module, the matching network, or other components of a radio frequency plasma processing device. Computer processing device 1000 may include one or more central processing units (singular "CPU" or plural "CPUs") 1005 disposed on one or more printed circuit boards (not otherwise shown). Computer processing device 1000 may further include any type of processing deice or programmable logic controller known in the ark. Computer processing device 1000 may also perform the functions of a controller, as a processor, and be used according to the methods and systems described above with respect to FIGS. 1-9. As such, computer processing device 1000 may be a controller, processor, perform the functions of the controller and/or processor, and may be used to determine capacitor positions within a matching network.

Each of the one or more CPUs 1005 may be a single-core processor (not independently illustrated) or a multi-core processor (not independently illustrated). Multi-core processors typically include a plurality of processor cores (not shown) disposed on the same physical die (not shown) or a plurality of processor cores (not shown) disposed on multiple die (not shown) that are collectively disposed within the same mechanical package (not shown). Computer processing device 1000 may include one or more core logic devices such as, for example, host bridge 1010 and input/output ("1O") bridge 1015.

CPU 1005 may include an interface 1008 to host bridge 1010, an interface 1018 to system memory 1020, and an interface 1023 to one or more 1O devices, such as, for example, graphics processing unit ("GFX") 1025. GFX 1025 may include one or more graphics processor cores (not independently shown) and an interface 1028 to display 1030. In certain embodiments, CPU 1005 may integrate the functionality of GFX 1025 and interface directly (not shown) with display 1030. Host bridge 1010 may include an interface 1008 to CPU 1005, an interface 1013 to IO bridge 1015, for embodiments where CPU 1005 does not include interface 1018 to system memory 1020, an interface 1016 to system memory 1020, and for embodiments where CPU 1005 does not include integrated GFX 1025 or interface 1023 to GFX 1025, an interface 1021 to GFX 1025.

One of ordinary skill in the art will recognize that CPU 1005 and host bridge 1010 may be integrated, in whole or in part, to reduce chip count, motherboard footprint, thermal design power, and power consumption. 1O bridge 1015 may include an interface 1013 to host bridge 1010, one or more interfaces 1033 to one or more IO expansion devices 1035, an interface 1038 to keyboard 1040, an interface 1043 to mouse 1045, an interface 1048 to one or more local storage devices 1050, and an interface 1053 to one or more network interface devices 1055.

Each local storage device 1050 may be a solid-state memory device, a solid-state memory device array, a hard disk drive, a hard disk drive array, or any other non-transitory computer readable medium. Each network interface device 1055 may provide one or more network interfaces including, for example, Ethernet, Fibre Channel, WiMAX, Wi-Fi, Bluetooth, EtherCAT, Device Net, Mod Bus, RS-232, or any other network protocol suitable to facilitate networked communications. Computer processing device 1000 may include one or more network-attached storage devices 1060 in addition to, or instead of, one or more local storage devices 1050. Network-attached storage device 1060 may be a solid-state memory device, a solid-state memory device array, a hard disk drive, a hard disk drive array, or any other non-transitory computer readable medium. Network-attached storage device 1060 may or may not be collocated with computer processing device 1000 and may be accessible to computer processing device 1000 via one or more network interfaces provided by one or more network interface devices 1055.

One of ordinary skill in the art will recognize that computer processing device 1000 may include one or more application specific integrated circuits ("ASICs") that are configured to perform a certain function, such as, for example, hashing (not shown), in a more efficient manner. The one or more ASICs may interface directly with an interface of CPU 1005, host bridge 1010, or 10 bridge 1015. Alternatively, an application-specific computing device (not shown), sometimes referred to as mining systems, may be reduced to only those components necessary to perform the desired function, such as hashing via one or more hashing ASICs, to reduce chip count, motherboard footprint, thermal design power, and power consumption. As such, one of ordinary skill in the art will recognize that the one or more CPUs 1005, host bridge 1010, 10 bridge 1015, or ASICs or various sub-sets, super-sets, or combinations of functions or features thereof, may be integrated, in whole or in part, or distributed among various devices in a way that may vary based on an application, design, or form factor in accordance with one or more example embodiments. As such, the description of computer processing device 1000 is merely exemplary and not intended to limit the type, kind, or configuration of components that constitute a computing device suitable for performing computing operations, including, but not limited to, hashing functions. Additionally, one of ordinary skill in the art will recognize that computing device 1000, an application specific computing device (not shown), or combination thereof, may be disposed in a standalone, desktop, server, or rack mountable form factor.

One of ordinary skill in the art will recognize that computing device 1000 may be a cloud-based server, a server, a workstation, a desktop, a laptop, a netbook, a tablet, a smartphone, a mobile device, and/or any other type of computing device in accordance with one or more example embodiments.

In certain embodiments, advantages of the present disclosure may provide for computer executable instructions for improving repeatability of capacitor positions associated with matching networks in radio frequency plasma processing devices.

In certain embodiments, advantages of the present disclosure may provide improved repeatability of tuning of capacitors associated with matching networks in radio frequency plasma processing devices.

In certain embodiments, advantages of the present disclosure may provide a method for storing optimized capacitor positions for plasma processing conditions, which may increase the consistency of the capacitor trajectories.

The foregoing description, for purposes of explanation, used specific nomenclature to provide a thorough understanding of the disclosure. However, it will be apparent to one skilled in the art that the specific details are not required to practice the systems and methods described herein. The foregoing descriptions of specific examples are presented for purposes of illustration and description. They are not intended to be exhaustive of or to limit this disclosure to the precise forms described. Obviously, many modifications and variations are possible in view of the above teachings. The examples are shown and described in order to best explain the principles of this disclosure and practical applications, to thereby enable others skilled in the art to best utilize this disclosure and various examples with various modifications as are suited to the particular use contemplated. It is intended that the scope of this disclosure be defined by the claims and their equivalents below.

What is claimed is:

1. A method for calibrating a capacitor in a matching network in a radio frequency plasma processing device, the method including:
   identifying the capacitor in the matching network;
   measuring the impedance of the matching network as a whole;
   driving the capacitor from a zero step value to a predefined step value;
   measuring impedance at each step between the zero step value and the predefined step value;
   identifying the measured impedance for each step value to a predefined impedance curve; and
   matching a capacitor position to a specific impedance based on the identifying the measured impedance for each step value to the predefined impedance curve.

2. The method of claim 1, wherein the predefined step value is about two thousand steps.

3. The method of claim 1, further comprising identifying a range of capacitor values for a plasma processing condition.

4. The method of claim 1, wherein the measuring comprises reporting a capacitor position based on an impedance of the matching network.

5. The method of claim 1, further comprising optimizing a steps per percentage ratio in a range of the capacitor values used most frequently.

6. The method of claim 5, wherein the optimizing comprises identifying a range of step values where the capacitor is used based on frequency of a time period.

7. A matching network comprising:
   a programmable logic controller connected to the matching network, the programmable logic controller to:
   identify a capacitor in the matching network;
   measure the impedance of the matching network as a whole;
   drive the capacitor from a zero step value to a predefined step value;
   measure impedance at each step between the zero step value and the predefined step value;
   identify the measured impedance for each step value to a predefined impedance curve; and
   match a capacitor position to a specific impedance based on the identifying the measured impedance for each step value to a predefined impedance curve.

8. The matching network of claim 7, wherein the programmable logic controller further implements a capacitor calibration to report at least on position value.

9. The matching network of claim 7, wherein the programmable logic controller further identifies a range of step values where the capacitor is used about ninety percent of a time period.

10. The matching network of claim 7, wherein the programmable logic controller further identifies a capacitor in the matching network and identifies a range of step values where the capacitor is used.

11. The matching network of claim 10, wherein the programmable logic controller further matches the calibration of the capacitor to a predefined impedance curve.

12. The matching network of claim 7, wherein the programmable logic controller further reports a capacitor position based on an impedance of the matching network.

13. The matching network of claim 7, wherein the programmable logic controller further records a range of capacitor values for a plasma processing condition.

14. A method for calibrating a capacitor in a matching network in a radio frequency plasma processing device, the method including:
   documenting a plurality of known plasma processing conditions;
   recording a range of capacitor values for a plasma processing condition;
   determining a range of the capacitor values that are used frequently for the plasma processing condition;
   optimizing a steps per percentage ratio in the range of capacitor values most frequently used;
   developing a predefined impedance curve for the capacitor values;
   calibrating the capacitor to the predefined impedance curve; and
   loading a capacitor calibration into the matching network.

15. The method of claim 14, wherein the capacitor calibration comprises the capacitor positions most frequently used.

16. The method of claim 14, wherein the recorded range of capacitor values comprises a capacitor range that is a subset of a full capacitor range.

17. The method of claim 14, further comprising measuring an impedance of the matching network.

18. The method of claim 14, wherein the measuring comprises measuring about two thousand impedance steps for the capacitor.

* * * * *